United States Patent [19]

Miwa et al.

[11] Patent Number: 4,879,681

[45] Date of Patent: Nov. 7, 1989

[54] SEMICONDUCTOR INTEGRATED CIRCUIT DEVICE

[75] Inventors: Hideo Miwa, Kodaira; Kazuhiro Tsuruoka, Tokyo; Koudou Yamauchi; Hitoshi Endoh, both of Ohme; Masanori Odaka, Kodaira, all of Japan

[73] Assignees: Hitachi, Ltd.; Hitachi VLSI Engineering Corp., both of Tokyo, Japan

[21] Appl. No.: 293,760

[22] Filed: Jan. 5, 1989

Related U.S. Application Data

[63] Continuation of Ser. No. 137,734, Dec. 24, 1987.

[30] Foreign Application Priority Data

Dec. 24, 1986 [JP] Japan .................................. 61-306462

[51] Int. Cl.[4] ............................................. G11C 13/00
[52] U.S. Cl. ................................ 365/189.01; 365/168; 365/189.05; 365/233.5; 307/530
[58] Field of Search ............... 365/189, 182, 184, 168, 365/206, 207, 228, 190; 307/530

[56] References Cited

U.S. PATENT DOCUMENTS 4,791,613 12/1988 Hardee ................................ 365/189

Primary Examiner—Terrell W. Fears
Attorney, Agent, or Firm—Antonelli, Terry & Wands

[57] ABSTRACT

A semiconductor memory device includes an input circuit and an output circuit. To prevent the erroneous operation of the input circuit by the noise which develops at the time of the change of the output signal of the output circuit, the threshold voltage of the input circuit is changed, or an internal signal generated by the internal circuit is fixed to a predetermined level. In an output circuit having a tri-state output function, the threshold voltage of the input circuit is changed when the output is brought into the high impedance state, or the internal signal generated by the input circuit is fixed to a predetermined state. Using these arrangements it is possible to prevent the erroneous operation of the input circuit by the noise occurring when the output is brought into the high impedance state. Furthermore, in an output circuit having a tri-state output function, the threshold voltage of the input circuit is changed when the output signal of the output circuit is brought into the high impedance state, too, when the output signal changes. This makes it possible to prevent an erroneous detection of the level of the input signal which might otherwise be caused by the noise.

34 Claims, 7 Drawing Sheets

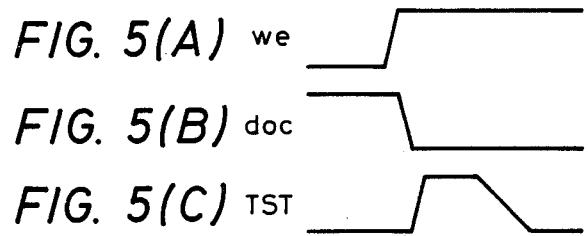
FIG. 5(A) we
FIG. 5(B) doc
FIG. 5(C) TST
FIG. 6
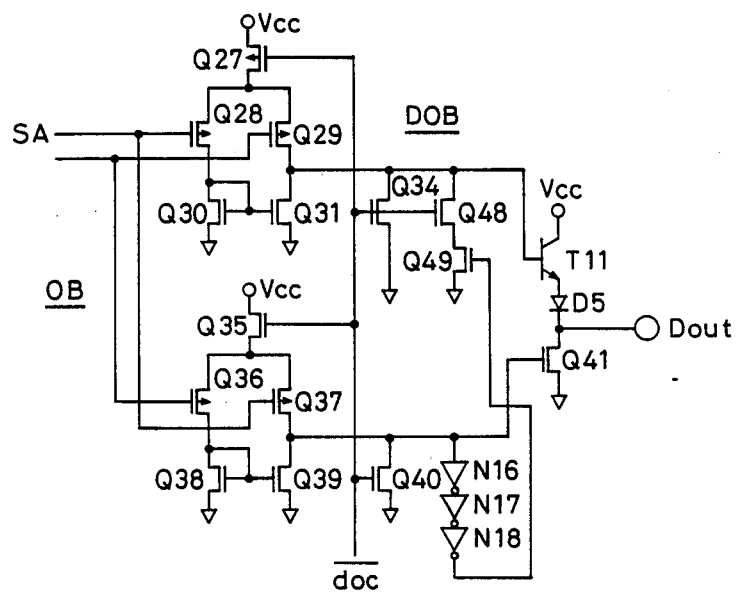
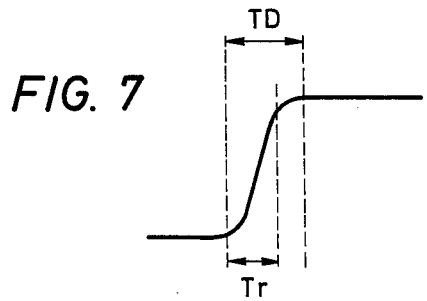
FIG. 7

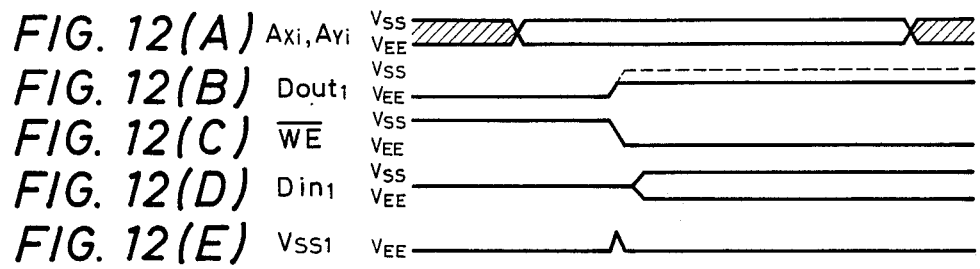
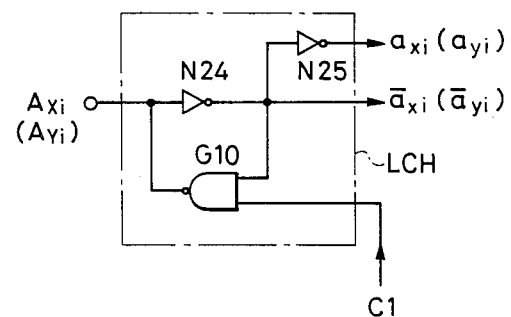
FIG. 13

SEMICONDUCTOR INTEGRATED CIRCUIT DEVICE

This is a continuation of application Ser. No. 137,734, filed Dec. 24, 1987.

BACKGROUND OF THE INVENTION

This invention relates to semiconductor integrated circuit devices and relates, for example, to a technique which is effective when applied to static RAMs (Random Access Memories) comprising the combination of bipolar transistors and CMOS (complementary MOS) circuits.

Japanese Patent Laid-Open No. 58193/1981 proposes a static RAM comprising bipolar transistors and CMOS circuits in order to improve the operation speed of the static RAM.

The static RAM of the type described above is typically mounted to a printed circuit board for use. Therefore, the output circuit of the static RAM must be able to drive load capacitance (parasitic capacitance) of a relatively large value such as floating capacitance existing in the mounting substrate such as the printed circuit board which is connected to the output terminals, and input capacitance of signal input devices that receive the output signals of this static RAM. To drive such load capacitance at a high speed, the output circuit described above must have a relatively large current supply capacity. The output circuit drives the load capacitance by discharging or charging it up. Therefore, a relatively large current flows through a power source wiring or a ground potential wiring of the static RAM when the output circuit drives the load capacitance having a relatively large value. The power source voltage wiring $V_{cc}$ and the ground potential wiring $V_{ss}$ inside the RAM have a resistance component and an inductance component that cannot be neglected, respectively. Therefore, noise of a relatively large value develops in these wirings when a current of a relatively large value flows.

When the potential of the ground potential line of the circuit is raised temporarily by the noise described above, the logic threshold voltage of the input circuit that receives the input signals from the output terminals of the static RAM, such as an address buffer, rises by a voltage corresponding to the rise of the ground potential. This means that the high level margin of the input circuit that receives the input signal drops when viewed from the input signal supplied from the output terminal. In other words, even if the level is one that must be judged as the high level, it is judged erroneously as the low level in the input circuit due to the rise of the logic threshold voltage described above.

Particularly in the case of RAMs of the type in which access is made in the unit of a plurality of bits such as x4 or x8 bits, four or eight output circuits incorporated in the RAM operate simultaneously so that the rise of the ground potential of the circuit can never be neglected.

SUMMARY OF THE INVENTION

The inventors of the invention found out that in RAMs with built-in output circuits having a tri-state output function (capable of taking the output of a high impedance state in addition to the high level output and the low level output), when its output is compulsively brought into the high impedance state by an output control signal during the transition period of the output signal of its output circuit, a large noise develops in the ground potential wiring of the circuit, too. As a result of studies, the inventors found out that when the output is changed to the high impedance state during the transition period of the output signal, a relatively large current that has previously been flowing for charging up the load capacitance is cut off within an extremely short period of time. Accordingly, reverse electromotive force is generated by the inductance component of the power supply wiring. The inventors found out also that this reverse electromotive force is transmitted to the ground wiring through capacitance coupling between the power supply wiring and the ground wiring of the circuit and raises the potential of the ground wiring.

It is therefore an object of the present invention to provide a semiconductor integrated circuit device having fewer erroneous operations.

It is another object of the present invention to provide a semiconductor integrated circuit device which improves the operation speed as well as the operation margin.

These and other objects and novel features of the present invention will become more apparent from the following detailed description taken in conjunction with the accompanying drawings.

Among the inventions disclosed herein, the following will illustrate a typical example.

In the present invention, when the output signal of the output circuit which receives an input signal supplied thereto changes from the level on the side of the power source voltage to the level of the ground potential of the circuit, the output signal of the input circuit which receives the input signal supplied from the output terminals of the output circuit is fixed for a predetermined period, or the logic threshold voltage of the input circuit is shifted to the ground potential side of the circuit for a predetermined period. Alternatively, the output signal of the input circuit is fixed for a predetermined period or the logic threshold voltage of the input circuit is shifted to the ground potential side of the circuit for a predetermined period by detecting the change timing of a control signal which changes the output circuit from the operative state to the inoperative state. In an output circuit having a tri-state output function, an output control signal for establishing the output high impedance state is substantially invalidated by a delay signal of a signal to be outputted, in the transition period of the output signal.

According to the means described above, the erroneous operation of the input circuit can be prevented by fixing the output signal of the input circuit or shifting its logic threshold voltage to the ground potential side of the circuit when the output circuit generates an output signal which floats up the ground potential of the output circuit or the output circuit is rendered inoperative. As to the tri-state output circuit, the change to the output high impedance stat is substantially invalidated during the transition period of the output signal and thus the occurrence of noise can be restricted.

BRIEF DESCRIPTION OF THE DRAWINGS

FIGS. 5(A) to 5(C) are timing charts useful for explaining the operation of the embodiment shown in FIG. 4;

FIG. 6 is a circuit diagram showing still another embodiment of the present invention;

FIG. 7 is a waveform diagram useful for explaining the operation of the embodiment shown in FIG. 6;

FIGS. 12(A) to 12(E) are waveform diagrams useful for explaining the operation of FIG. 8; and FIG. 13 is a circuit diagram showing still another embodiment of the present invention.

DESCRIPTION OF THE PREFERRED EMBODIMENTS

Embodiment 1

Figure 2:
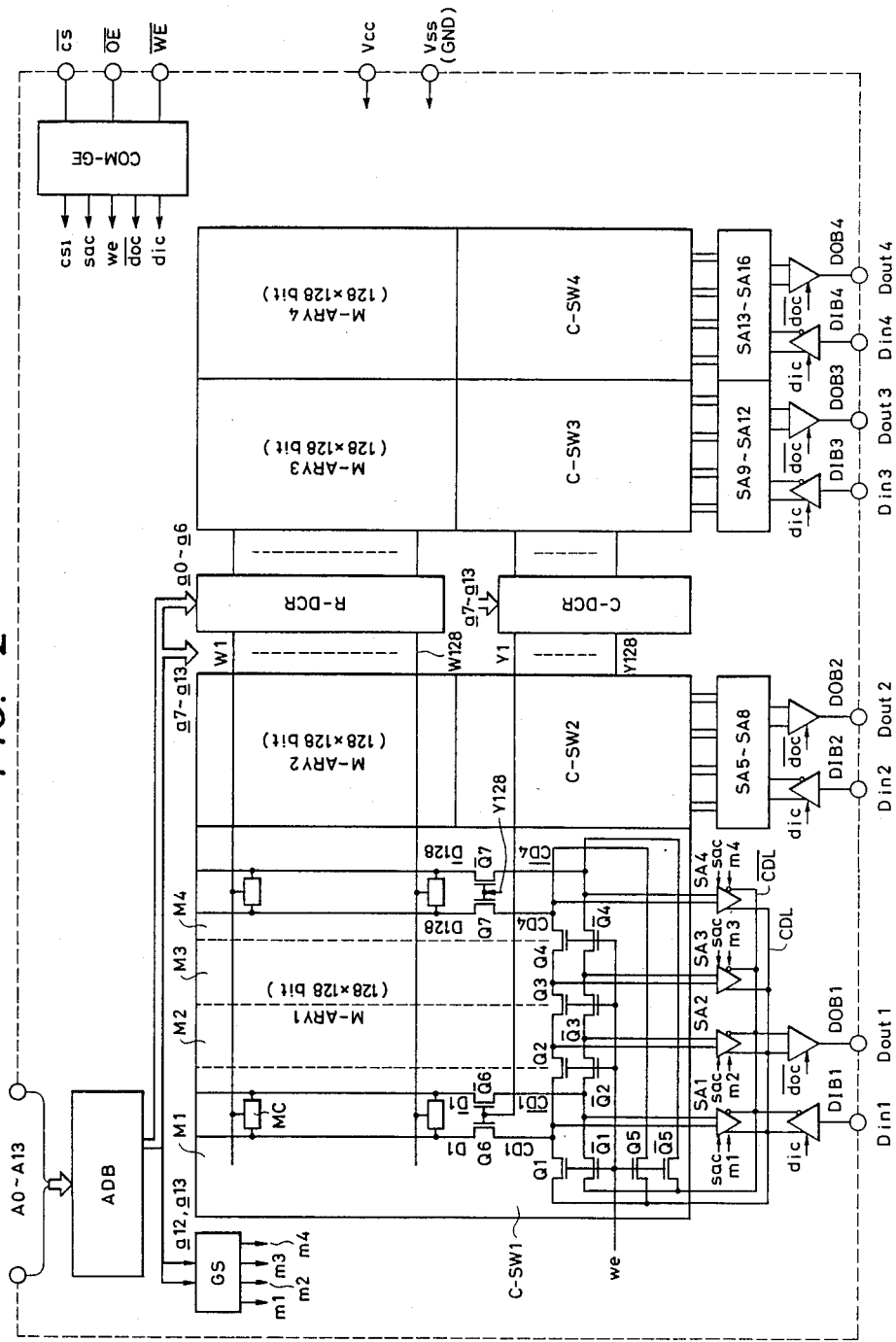
FIG. 2 is a block diagram showing an example of a static RAM to which the present invention is applied.

FIG. 2 is a block diagram of a static RAM to which the present invention is applied. In the drawing, circuit portions encompassed by a dashed line are formed on one semiconductor substrate such as of a single crystal silicon, by known semiconductor integrated circuit techniques, though the invention is not particularly limited thereto.

The static RAM of this embodiment has four matrixes (memory arrays M-ARY1 to M-ARY4) each having a memory capacity of 128 rows by 128 columns=16,384 bits (approx. 16K bits). In other words, the static RAM has a memory capacity of about 64K bits in total, though the value is not particularly limitative. An address circuit for selecting a desired memory cell MC from each memory array M-ARY1~M-ARY4 having a plurality of memory cells MC comprises an address buffer ADB, a row address decoder R-DCR, a column address decoder C-DCR, column switches C-SW1~C-SW4, etc.

Figure 9:
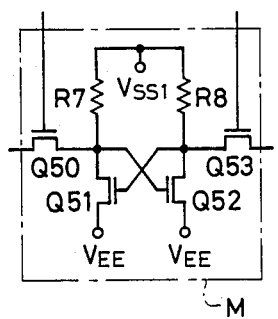
FIG. 9 is a circuit diagram showing an example of a memory cell.

Though not shown in the drawing, each memory cell MC described above has mutually the same structure such as that of the memory cell shown in FIG. 9, though not particularly limited thereto. In other words, the memory cell MC consists of a pair of N-channel memory MOSFETs $Q_{51}$, $Q_{52}$ whose gates and drains are mutually cross-connected, data holding resistors R7 and R8 connected to the drains of these transistors, and N-channel transfer gate MOSFETs $Q_{50}$ and $Q_{53}$ that are disposed between the pair of memory MOSFETs $Q_{51}$, $Q_{52}$ and a pair of complementary data lines D, $\overline{D}$, respectively. In this embodiment, each memory cell MC holds the memory information when the power source voltage $V_{cc}$ is supplied to the common junction of the resistors R7 and R8.

The ground potential $V_{ss}$ is supplied to the sources of the memory MOSFETs $Q_{51}$ and $Q_{52}$. Each resistor has a high resistance value such as several meg-ohms or several giga-ohms in order to reduce power consumption of the memory cell MC in the data holding state. The resistor consists, for example, of a polysilicon layer which has a relative high resistance value and is formed on the surface of a semiconductor substrate forming the MOSFET through a relatively thick field insulation film.

A signal circuit for reading/writing the data consists of data input circuits DIB1~DIB4, data output circuits DOB1~DOB4 and sense amplifiers SA1~SA16, though this is not particularly limitative.

A timing circuit for controlling the data read/write operation consists of an internal control signal generation circuit COM-GE and a sense amplifier selection circuit GS, though the circuit construction is not particularly limitative.

The row system address selection lines (word lines W1~W128) receive 128 decoded output signals obtained on the basis of address signals A0~A6 from a row decoder R-DCR. The decoded output signals are supplied in common to the word lines W1~W128 of two each memory arrays M-ARY1, M-AR2 and M-ARY3, M-ARY4 that are disposed on the right and left with the row address decoder R-DCR being the center, though this arrangement is not particularly limitative.

The address selection lines Y1~Y128 of the column system also receive 128 decoded output signals obtained on the basis of the address signals A7~A13 from the column decoder C-DCR. The decoded output signals are supplied in common to two each column switches C-SW1, C-SW2 and C-SW3, C-SW4 that are disposed on the right and left with the column address decoder C-DCR being the center, though the arrangement is not particularly limitative.

The address buffer ADB receives the address signals A0~A13 supplied from the external input terminals to which the address signals are supplied from outside, and generates the internal complementary address signals a0~a13 on the basis of the address signals. Incidentally, the internal address signal a0 consists of an internal address signal a0 having the same phase as the address signal A0 and an internal address signal $\overline{a0}$ having an inversed phase with respect to the address signal A0. The other internal complementary address signals a1~a13 consist likewise of the internal address signals a1~a13 having the same phase and the internal address signals $\overline{a1}$~$\overline{a13}$ having the inversed phase. In this embodiment, the address signal is to obtain a potential between the ground potential of the circuit and a positive potential.

Among the internal complementary address signals a0~a13, the internal complementary address signals a7 to a13 are supplied to the column address decoder C-DCR, though not particularly limitative. The column address decoder C-DCR decodes these internal complementary address signals a7~a13 and supplies the resulting selection signals (decoded output signals) to the gates of switching MOSFETs (insulated gate field effect transistors) Q6, Q6~Q7, Q7 inside the column switches C-SW1~C-SW4.

Among the word lines W1~W128 in each memory array M-ARY1~M-ARY4, one word line designated by the combination of the address signals A0~A6 from outside is selected by the row address decoder R-DCR, and a pair of complementary data lines designated by the combination of the address signals A7~A13 from outside are selected from 128 pairs of complementary data lines by the column address decoder C-DCR. In this manner, one each memory cell MC disposed at the point of intersection of the selected word line and complementary data lines is selected in each memory array M-ARY1~M-ARY4.

The memory data read out from the selected memory cell MC appears on one of the four pairs of sub-common complementary data lines CD1, $\overline{CD1}$ ~ CD4, $\overline{CD4}$. In other words, the sub-common complementary data lines CD1, $\overline{CD1}$ ~ CD4, $\overline{CD4}$ correspond to the memory blocks M1~M4 of 32 pairs obtained by dividing 128 pairs of complementary data lines by four, such as the memory array M-ARY1 which is illustrated as a typical example. The sense amplifiers SA1~SA4 are disposed in such a manner as to correspond to the divided sub-common complementary data lines CD1, $\overline{CD1}$ ~ CD4, $\overline{CD4}$, respectively.

The reason why the sub-common complementary data lines are divided to CD1, $\overline{CD1}$ ~ CD4, $\overline{CD4}$ and the sense amplifiers SA1~SA4 are disposed in such a manner as to correspond to them is to divide (reduce) the parasitic capacitance of the common complementary data lines and to improve the data read operation speed from the memory cell.

The sense amplifier selection circuit GS operates to decode in the four combinations on the basis of the address signals A12, A13 described above and generates the sense amplifier selection signals m1~m4. In other words, it decodes the address signals A12, A13 and generates the selection signals m1~m4.

Among the four sense amplifiers SA1~SA4 (SA5~SA8, SA9~SA12 and SA13~SA16: since the sense amplifiers SA5 to SA16 are the same as the sense amplifiers SA1 to SA4, they are not shown in the drawing), one sense amplifier that corresponds to the complementary data lines selected by the column switches is rendered operative by the selection signals m1~m4 and by the timing signal sac, and its output is transmitted to the common complementary data lines CDL, $\overline{CDL}$.

The common complementary data lines CDL, $\overline{CDL}$ are connected between the input terminals (input nodes) of the data output circuit DOB and the output terminals (output nodes) of the data input circuit DIB. In the write operation, the divided sub-common complementary data lines CD1, $\overline{CD1}$ ~ CD4, $\overline{CD4}$ are short-circuited by the transfer gate MOSFETs Q1, $\overline{Q1}$ ~ Q5, $\overline{Q5}$ that receive the write control signal we.

Though not particularly limitative, the internal control signal generation circuit COM-GE receives three internal control signal $\overline{CS}$ (chip select signal), $\overline{WE}$ (write enable signal) and $\overline{OE}$ (output enable signal) and generates an internal chip selection signal csl, a sense amplifier operation timing signal sac, a write control signal we, a data input control signal dic and a data output control signal doc. In this embodiment, since the various signals described above can be generated by the chip select signal $\overline{CS}$ and the write enable signal $\overline{WE}$, the output enable signal $\overline{OE}$ may or may not exist.

In the drawing, symbol $V_{cc}$ represents the external terminal to which the power source voltage $V_{cc}$ is applied. This external terminal $V_{cc}$ is connected to the power source wiring formed on the semiconductor substrate in order to supply the power source voltage $V_{cc}$ to each circuit shown in the drawing. Symbol $V_{ss}$ represents the external terminal to which the ground potential $V_{ss}$ of the circuit is applied. This external terminal $V_{ss}$, too, is connected to the ground potential wiring of the circuit formed on the semiconductor substrate to supply the ground potential $V_{ss}$ of the circuit to each circuit shown in the drawing. In other words, each circuit is connected to the external terminal $V_{cc}$ through the power source wiring, and to the external terminal $V_{ss}$ through the ground wiring.

The following circuits are added to the output circuit DOB and the address buffer ADB in the RAM having the construction described above in order to improve its operation margin.

Figure 1:
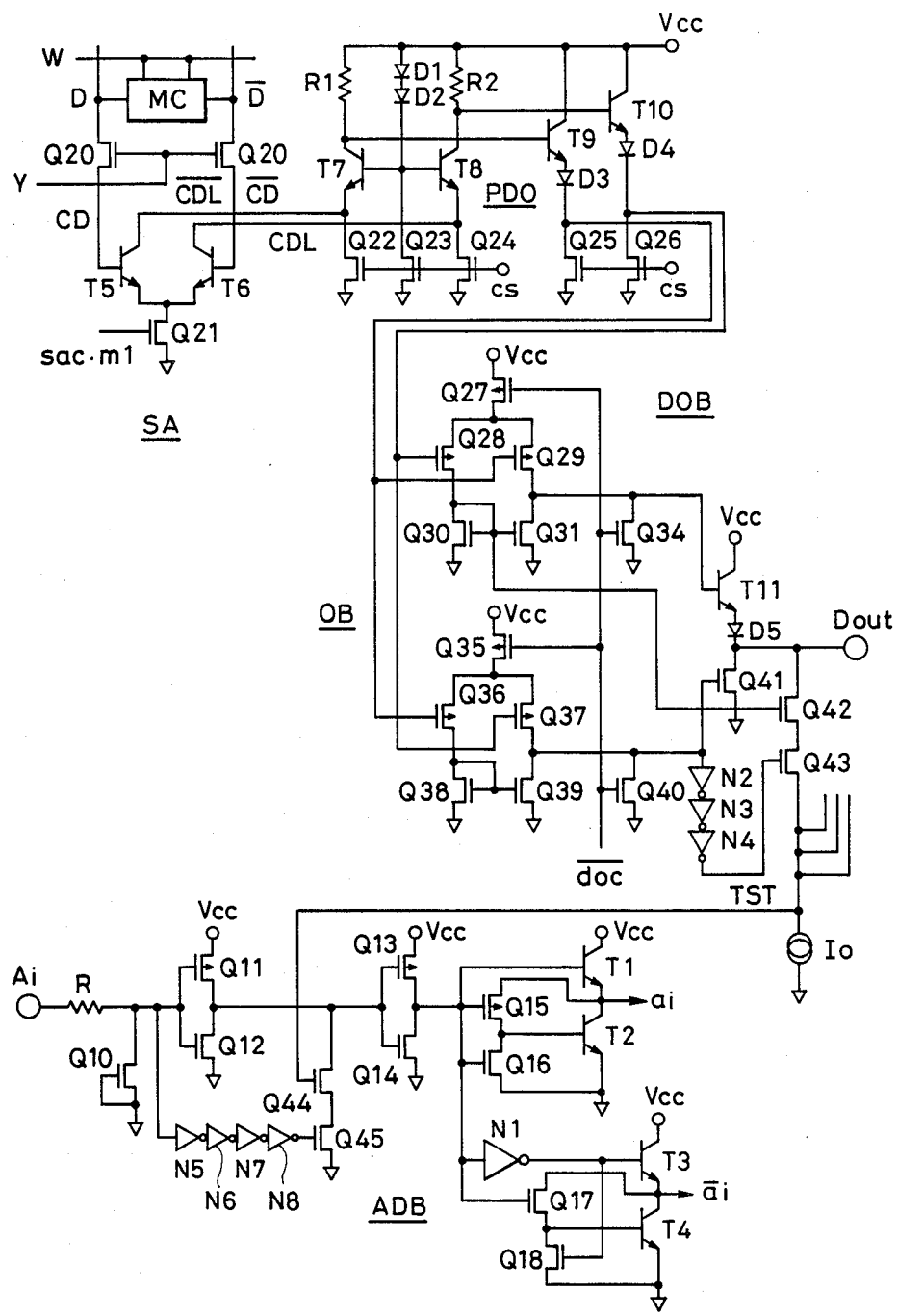
FIG. 1 is a circuit diagram showing an embodiment of the present invention.

FIG. 1 shows the example of the output circuit DOB, the address buffer ADB and their additional circuits. In the drawing, MOSFETs with an arrow at their channel portions such as MOSFET Q11 represent P-channel MOSFETs and are discriminated from N-channel MOSFETs, such as MOSFET Q10 which are not provided with an arrow. This also holds true of the later-appearing FIGS. 4, 6, 8, 9, 11 and the like.

The address buffer ADB consists of a plurality of unit circuits (unit address buffers) and each unit circuit corresponds to the address signal on a 1:1 basis. Since each unit circuit has mutually the same construction, only the unit circuit corresponding to the address signal Ai will be explained.

In FIG. 1, the resistor R and MOSFET Q10 together form a gate protection circuit for protecting the gate insulation film of MOSFETs Q11 and Q12 from an external surge voltage applied to the input terminal Ai.

MOSFETs Q11, Q12 and Q13, Q14 constitute two-stage cascaded CMOS inverter circuits. Accordingly, a signal having the same phase as that of the input signal of the CMOS inverter circuit (Q11, Q12) can be obtained from the CMOS inverter circuit (Q13, Q14).

The output signal of the CMOS inverter circuit (Q13, Q14) is sent, on one hand, to the output circuit for generating the internal complementary address signal ai having the same phase as the address signal Ai from the external terminal described above. In other words, the output signal is supplied to the base of an output bipolar transistor T1 for charging a capacitive load, not shown. The output bipolar transistor T2 which is cascaded with the output transistor T1 discharges the capacitive load. Therefore, the output signal of the CMOS inverter circuit (Q13, Q14) described above inverted by the P-channel MOSFET Q15 and the N-channel MOSFET Q16 is supplied to the base of the transistor T2. Unlike the CMOS inverter circuit described above, however, the source of the P-MOSFET Q15 is connected to the junction (output terminal) of the transistors T1 and T2.

The output signal of the CMOS inverter circuit (Q13, Q14) is sent, on the other hand, to the output circuit which generates the internal complementary dress signal $\overline{ai}$ having the opposite phase to that of the address signal Ai from the external terminal described above. In other words, the output signal is inversed by the CMOS inverter circuit N1 having the same construction as the CMOS inverter circuit (Q13, Q14) described above and is supplied to the base of the output bipolar transistor T3 for charging the capacitive load not shown in the drawing. The output bipolar transistor T4 which is cascaded with the output transistor T3 discharges the capacitive load. Therefore, the output of the CMOS inverter circuit (Q13, Q14) described above is supplied to the base of this transistor T4 through the source-follower MOSFET Q17. MOSFET Q18 serves not only as the load of the source follower MOSFET Q17 described above but also as a switch MOSFET for discharging the charge built up at the base of the transistor T4.

The source of MOSFET Q15 is connected to the collector of the transistor T2, but not to the power source voltage $V_{cc}$ in the circuit arrangement described above, in order to prevent the bipolar transistor T2 from being driven in a saturation range. Similarly, the drain of MOSFET Q17 is connected to the collector of the transistor T4, but not to the power source voltage $V_{cc}$, in order to prevent the bipolar transistor T4 from being driven in the saturation range. In this manner, the switching operation speed is improved.

In this embodiment, the bipolar transistors having a greater current driving capacity than MOSFETs are used at the output portion of the address buffer so that charge/discharge of the parasitic capacitance having a relatively large value, such as the gate capacitance that adds to the gates of a large number of MOSFETs constituting the address decoder as the load, can be made at a high speed. Such output circuits are disposed at the output portions of the address decoders R-DCR, C-DCR in FIG. 2, too, in order to improve the selection speed of the memory arrays (not shown in the drawing).

In order to secure the level margin on the high level side of the input signal supplied from the external terminal Ai in this embodiment, the signal supplied from the input terminal Ai is supplied to the gate of MOSFET Q45 through a delay circuit consisting of inverter circuits N5 to N8 that are cascaded with one another. This MOSFET Q45 is connected in series with MOSFET Q44 that receives a later-appearing threshold trigger signal TST. The series circuit of MOSFETs Q44 and Q45 is interposed between the output terminal of the CMOS inverter circuit (Q11, Q12) and the ground potential of the circuit.

The sense amplifiers SA1 to SA16 have mutually the same construction. Therefore, FIG. 1 shows in detail only one sense amplifier SA. The sense amplifier SA consists of differential bipolar transistors T5, T6 whose bases are connected to the sub-common complementary data lines CD, $\overline{CD}$ and an N-channel MOSFET Q21 which is disposed between the common emitter of these transistors T5, T6 and the ground potential point of the circuit and selectively allows the operation current to flow on basis of the control signal applied to its base. In other words, a constant current is supplied to the differential transistors in the sense amplifier designated by the sense amplifier selection signals mi (i=1~4) in synchronism with the operation timing signal. The collectors of these differential transistors T5, T6 are connected to the common complementary data lines CDL, $\overline{CDL}$, respectively. Though not shown in the drawing, the collectors of the differential transistors forming the remaining three similar sense amplifiers are connected to the common complementary data lines CDL, $\overline{CDL}$, too.

The output signal of the sense amplifier appearing on the common complementary data lines CDL, $\overline{CDL}$ is amplified by an initial stage circuit PD0 of the data output circuit DOB to an output signal substantially equivalent to ECL (emitter-coupled logic). The complementary data lines CDL, $\overline{CDL}$ are connected to the emitters of the base-grounded amplification transistors T7 and T8. A bias voltage ($V_{cc}-2 V_f$) formed by diodes D1, D2 and a MOSFET Q23 as a constant current source for passing the operation currents of the diodes is supplied to the bases of these transistors T7 and T8. Incidentally, symbol $V_f$ represents a forward voltage of the diodes D1 and D2. MOSFETs Q22 and Q24 are disposed between the emitters of the transistors T7, T8 and the ground potential point of the circuit as the constant current source for supplying the bias current to the transistors T7, T8. Load resistors R1, R2 are disposed at the collectors of the transistors T7, T8. The collector outputs of these base-grounded type amplification transistors T7, T8 are transmitted to the next output circuit OB through emitter follower output transistors T9, T10 and level shift diodes D3, D4.

MOSFETs Q25 and Q26 are disposed as the constant current load at the emitters of the output transistors T9, T10 described above. MOSFETs Q22 to Q26 as the constant current source are selectively rendered operative by the internal chip selection signal cs, though this arrangement is not particularly limitative. Accordingly, these MOSFETs are turned OFF at the time of non-selection of the chip in order to reduce power consumption.

The output circuit OB is selectively rendered operative by the power switch MOSFET. Under the operative state, the output circuit OB has a level conversion function carried out by a differential amplification circuit having an active load circuit in a current mirror form and an output enable function. In other words, the complementary signals of the ECL level generated by the initial stage circuit PD0 are supplied, on one hand, to the gates of P-channel differential amplification MOSFETs Q28 and Q29. A P-channel power switch MOSFET Q27 for receiving the operation timing signal $\overline{doc}$ is disposed between the common source of these differential amplification MOSFETs Q28, Q29 and the power source voltage $V_{cc}$. N-channel active load MOSFETs Q30 and Q31 arranged in the current mirror form are disposed between the drains of the differential amplification MOSFETs Q28, Q29 and the ground potential point of the circuit. An N-channel MOSFET Q34 for receiving the control signal $\overline{doc}$ described above is disposed between the common drains of the MOSFETs Q29, Q31 as the output of the differential amplification circuit and the ground potential point of the circuit.

The complementary signals of the ECL level described above are applied, on the other hand, in the opposite phase to the input of the differential amplification circuit (Q35~Q40) which is similar to the differential amplification circuit (Q27~Q34). If the control signal $\overline{doc}$ is at the low level, the output signals of the CMOS level having the mutually opposite phases are obtained from the two differential amplification circuits, and if the control signal $\overline{doc}$ is at the high level, the differential amplification circuits are rendered inoperative and both N-channel MOSFETs Q34 and Q40 are turned ON so that the low level output signals can be obtained.

The output signals of the pair of differential amplification circuits described above are transmitted to the base of the emitter follower output transistor T11 formed by the bipolar NPN transistor for delivering the high level (a level close to $V_{cc}$) output signals to the external terminals $D_{out}$ and to the gate of the N-channel output MOSFET Q41 for delivering the low level (a level close to $V_{ss}$) output signals to the external terminal $D_{out}$, as shown in the drawing. Incidentally, in order to set the level of the output signals sent to the external terminals $D_{out}$ to the TTL level, a level shift diode D5 is disposed at the emitter of the transistor T11. As can be seen from the drawing, the transistor T11 and MOSFET Q41 cause the push-pull operation when the control signal $\overline{doc}$ is at the low level.

Since the definite circuit construction has been described with regard to one data output circuit DOB, the explanation on the other data output circuits will be omitted because their construction is the same.

The following circuit is disposed in each of the data output circuits described above in order to detect change of the output signal $D_{out}$ from the high level to the low level. One of the ends of a series circuit of MOSFETs Q42 and Q43 is connected to the output terminal described above. The high level of the output signal $D_{out}$ is transmitted through the MOSFETs Q42 and Q43 to the gate of MOSFET Q44 disposed in each unit circuit of the address buffer ADB as the signal TST. Incidentally, the signal line TST for transmitting this signal TST is connected in common for the other series MOSFETs disposed in the other data output circuits in the same circuit arrangement as the series MOSFETs Q42, Q43 described above, and the level is pulled down always to the ground potential of the circuit by a constant current source $I_o$ that supplies a very small current. In other words, the series circuit of MOSFETs having the same structure as the series MOSFETs Q42, Q43 are disposed in each of the data output circuits and connected to one signal line TST, and the constant current source $I_o$ is connected to this signal line TST.

Figure 3:
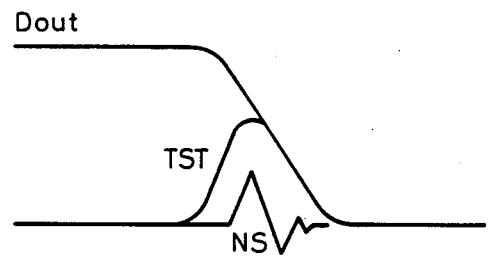
FIG. 3 is a waveform diagram useful for explaining the operation of the static RAM.

The drain output of MOSFET Q28, which is the signal that changes from the low level to the high level in the differential amplification circuit for generating the driving signal when the output transistor T11 is turned from ON to OFF, is supplied to the gate of the MOSFET Q42 described above. The signal which drives the output MOSFET Q41 is supplied to the gate of the MOSFET Q43 through the cascaded inverter circuits N2 to N4. As shown in the operation waveform diagram of FIG. 3, therefore, the signal TST is raised to the high level when the output signal $D_{out}$ changes from the high level to the low level, that is, at the timing at which the noise NS develops in the ground potential wiring of the circuit in the discharge operation of the load capacitance coupled to the output terminal $D_{out}$ described above. In other words, when the output signal changes from the high level to the low level, the output transistor T11 is changed from ON to OFF. When such a driving signal is generated, the drain output of MOSFET Q28 in this differential amplification circuit changes from the low level to the high level. Therefore, MOSFET Q42 is turned ON. At this time, the gate voltage of the output MOSFET Q41 changes from the low level to the high level. Therefore, the signal passing through the inverter circuits N2 to N4 changes belatedly from the high level to the low level. Since the MOSFET Q43 is changed from ON to OFF belatedly by the time set to the inverter circuits N2 to N4 in this manner, the high level of the output signal $D_{out}$ is transmitted to the signal TST. In consequence, while the output signal $D_{out}$ is at the high level, the signal TST, too, is at the high level and turns ON the MOSFET Q44.

If the input signal Ai to the unit circuit in the address buffer ADB is at the high level at this time, MOSFET Q45 is turned ON through the inverter circuits N5 to N8. Therefore, if the combined conductance of MOSFETs Q44 and Q45 is made sufficiently greater than that of P-channel MOSFET Q11 forming the CMOS inverter circuit, the output signal of this CMOS inverter circuit (Q11, Q12) is fixed at the low level. If the combined conductance of MOSFETs Q44 and Q45 is not very great, the combined conductance on the side of the N-channel MOSFET becomes great because these MOSFETs Q44 and Q45 are in parallel, with the N-channel MOSFET Q12, so that its logic threshold voltage is shifted to the low level side. Accordingly, even if the input signal Ai shifts equivalently to the low level by the occurrence of the noise NS described already, the output signal of the CMOS inverter circuit (Q11, Q12) does not change, so that the erroneous operation resulting from the changeover of the internal address signals ai, $\overline{ai}$ can be prevented.

The input circuit described above can be applied to those input circuits which receive control signals such as the chip selection signal $\overline{CS}$ and the write enable signal $\overline{WE}$, besides the address buffer described above. In this manner, the erroneous operation that the write state is established temporarily by the noise NS, for example, can be likewise prevented.

In the output circuit described above, MOSFET Q43 is turned ON only a predetermined period in which the output signal changes from the low level to the high level, and is turned OFF under the steady state where the output signal is kept at a predetermined high level. Accordingly, the problem that the output terminals are connected erroneously to those of the other output circuits through MOSFETs Q42, Q43, etc. can be eliminated.

In FIG. 1, each power source voltage node $V_{cc}$ is illustrated dividedly for the purpose of simplification, but each power source voltage node $V_{cc}$ would preferably be connected mutually by a power source wiring as can be understood from the description given above. Similarly, the ground potential node of the circuit is preferably mutually connected by the ground potential wiring, and this also holds true of the later-appearing Embodiments 2 and 3.

In the same way as the static RAM disclosed in U.S. patent application Ser. No. 701,226 filed Feb. 13, 1985, which is hereby incorporated by reference the output signals ai, $\overline{ai}$ of the address buffer ADB in the static RAM of this embodiment are supplied to the row decoder R-DCR and the column decoder C-DCR without passing through the latch circuit. In other words, the output signals ai, $\overline{ai}$ are transmitted to the decoders without being latched by the latch circuit so that the operation speed can be improved and the erroneous operation resulting from the noise can be reduced. For the detail of the row and column decoders, refer to the U.S. patent application described above because they are not shown in detail in the drawing.

Embodiment 2

Figure 4:
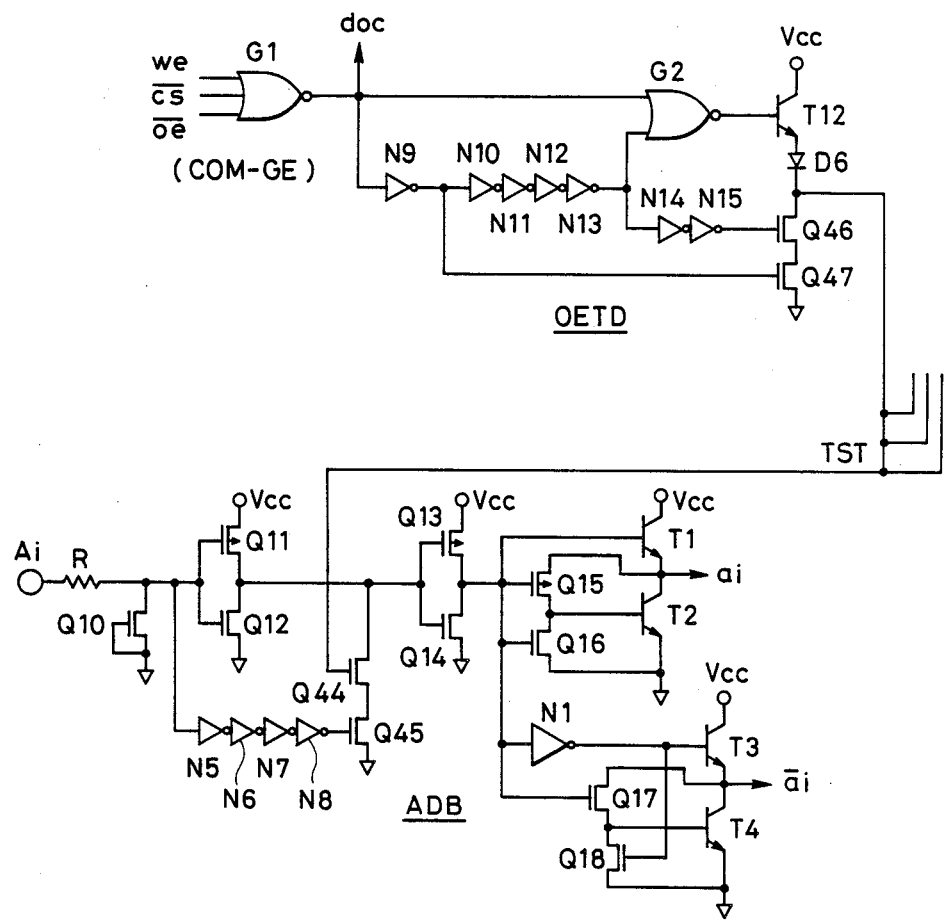
FIG. 4 is a circuit diagram showing another embodiment of the present invention.

FIG. 4 is a circuit diagram of the principal portions of another embodiment of the present invention.

In place of the circuit construction shown in FIG. 1 which detects the change of the output signal $D_{out}$ to the high level and generates the signal TST of the foregoing embodiment, this embodiment generates the signal TST irrespective of the practical occurrence of the noise when the output control signal doc for changing the output circuit from the operative state to the inoperative state (output high impedance state) is generated.

Accordingly, the following signal change detection circuit OETD is disposed in the internal control signal generation circuit COM-GE.

Though not particularly limitative, the internal control signal generation circuit COM-GE generates the output control signal doc by a NOR gate G1 which receives the internal write enable signal we formed on the basis of the write enable signal $\overline{WE}$, the chip select signal cs formed on the basis of the external chip signal $\overline{CS}$ and the output enable signal oe formed basis of the output enable signal $\overline{OE}$. Accordingly, in the RAM of this embodiment, the input terminal Din and the output terminal $D_{out}$ are connected inside the chip and then to one common external terminal. As shown in FIG. 2, therefore, the output enable control signal $\overline{OE}$ is provided in the RAM. The circuit construction using such an input/output terminal can reduce the number of external terminals.

When the control signal doc is switched from the high level to the low level in this embodiment, or, in other words, when the output circuit DOB changes from the operative state to the inoperative state as will be described elsewhere, the following signal change detection circuit OETD generating a one-shot pulse is disposed.

The signal doc described above is supplied to one of the input terminals of the NOR gate G2. The control signal doc is supplied to the other input of the NOR gate G2 through cascaded inverter circuits N9 to N13 constituting an inversion delay circuit. The output signal of this NOR gate circuit G2 is supplied to the base of the transistor T12 that generates a high level output signal. A level shift diode D6 and output MOSFETs Q46, Q47 for generating the output signal on the ground potential side of the circuit are disposed between the emitter of this transistor T12 and the ground potential point of the circuit. The signal to be supplied to the other input of the NOR gate circuit G2 is supplied to the gate of MOSFET Q46 through the cascaded inverter circuits N14 and N15 that together constitute the delay circuit. The output signal of the inverter circuit N9 is supplied to the gate of MOSFET Q47 described above.

The signal TST to be supplied to the gate of MOSFET Q44 disposed in each unit circuit inside the input circuit such as the similar address buffer ADB is delivered from the junction between MOSFET Q46 and the diode D6. In this embodiment, in order to supply the signal TST in common to a large number of circuits such as a large number of unit address buffers inside the address buffer ADB, a bipolar transistor such as T12 having a high current driving capacity is used.

The operation of this embodiment will be explained next with reference to the timing chart shown in FIG. 5.

The internal signal we is set to the low level in the read operation, the signal $\overline{cs}$ is set to the low level under the chip selection state and the signal $\overline{oe}$ is set to the low level under the output enable state. Therefore, when the signals we, $\overline{cs}$ and $\overline{oe}$ are all at the low level (or the logic "0"), the NOR gate circuit G1 sets the output control signal doc to the high level. This signal doc is inversed by the inverter circuits or the like, not shown, to the signal $\overline{doc}$ which is supplied to a data output circuit such as the one shown in FIG. 1. In this embodiment, it is not necessary to add the afore-mentioned inverters N2, N3, N4 and MOSFETs Q42, Q43 to the data output circuit DOB. Under this state, the output circuit DOB is under the operative state and delivers the output signal $D_{out}$ from the common output terminals.

When the write enable signal $\overline{WE}$ is changed from the high level to the low level and the write operation is instructed under this state, the internal signal we changes from the low level to the high level in response to the former. As a result, the output control signal doc changes to the low level and the output circuit DOB is switched from the operative state to the inoperative state. If the output signal Dout of the output circuit DOB is in the transition period at this time, the driving current is cut off within an extremely short period in the output circuit DOB and a large noise is generated in the power source voltage wiring by the reverse electromotive force due to the inductance component contained in the power source voltage supply wiring, for example. This noise floats up the ground potential of the circuit by the capacitance coupling with the ground wiring of the circuit. In this embodiment, since such a noise is likely to occur when the output circuit DOB is changed from the operative state to the inoperative state, the signal change detection circuit OETD generates the signal TST irrespective of the occurrence of the noise and fixes the output of the input circuit or shifts the logic threshold voltage to the low level side in the same way as described previously.

In other words, when the output control signal doc changes from the high level to the low level, one of the input signals of the NOR gate G2 is changed to the high level at this time. The transistor T12 is turned ON in response to the high level of the output signal of the NOR gate circuit G2 and the signal TST is changed from the low level to the high level. The output control signal doc is inversed and delayed through the inverter circuits N9 t N13 and applied to the other input of the NOR gate G2. The signal thus generated by reversal and delay changes from the low level to the high level after the passage of a predetermined period from the change of the output control signal doc from the high level to the low level. Accordingly, the output signal of the NOR gate circuit G2 changes from the high level to the low level and the transistor T12 is changed from ON to OFF.

The signal supplied to the other input of the NOR gate circuit G2 is delayed by the inverter circuits N14 and N15 and transmitted to the gate of MOSFET Q46. Accordingly, the MOSFET Q46 is turned ON after the transistor T12 is turned OFF, and changes the signal TST from the high level to the low level. At this time, since the output signal of the inverter circuit N9 changes quickly from the low level to the high level by the change of the output control signal doc to the low level, MOSFET Q47 is turned ON. Therefore, the change of the signal TST from the high level to the low level is made in synchronism with the ON state of MOSFET Q46. Incidentally, when the output control signal doc changes from the low level to the high level, MOSFET Q47 is turned OFF quickly.

At the timing where the output control signal doc changes from the high level to the low level, no input signal such as the address signal is supplied. In other words, since the address signal or the like is not changed, no problem occurs at all even if fixing of the level of the shift of the logic threshold voltage is made in the manner described above irrespective of existence of noise.

Embodiment 3

FIG. 6 is a circuit diagram showing the principal portions of still another embodiment of the present invention.

This embodiment suppresses the noise by adding the following circuit to the output circuit DOB.

Namely, the following circuits are added to the output circuit shown in FIG. 1. MOSFET Q34 for receiving the output control signal $\overline{doc}$ is disposed between the base of the output transistor T11 for sending the output signal on the power source voltage side and the ground potential point of the circuit, and its conductance is set to a relatively small value. Series MOSFETs Q48 and Q49 having a relatively large conductance value are connected in parallel with this MOSFET Q34. The output control signal $\overline{doc}$ is supplied to the gate of MOSFET Q48. The driving signal which is supplied to the gate of the output MOSFET Q41 on the ground potential side of the circuit is supplied to the gate of MOSFET Q49 described above through an inversion delay circuit consisting of cascaded inverter circuits N16 to N18.

As shown in the operation waveform diagram of FIG. 7, even if the output control signal $\overline{doc}$ is changed from the low level to the high level during the transition period Tr in which the output signal of the output circuit DOB in this embodiment changes from the low level to the high level, control by the output control signal $\overline{doc}$ is substantially invalidated. In other words, MOSFET Q34 is turned ON when the output control signal $\overline{doc}$ changes to the high level, but its conductance is set to a relatively small value. Therefore, the output transistor T11 is not turned OFF abruptly. Then, MOSFET Q49 is turned ON belatedly by the delay time TD through the inversion delay circuit consisting of the inverter circuits N16 to N18. Accordingly, since the base potential of the transistor T11 is pulled out from the high level to the low level by the large conductance of MOSFETs Q48 and Q49, the transistor T11 is turned OFF. Since the change-over of the output transistor T11 from the ON state to the OFF state is controlled substantially during the transition period of the output signal Dout, it becomes possible to prevent the current, which has flowing in order to charge up a large load capacitance to the power source wiring, from being cut off abruptly. Therefore, it becomes possible to prevent in advance the occurrence of the large noise due to the inductance component in the power source supply wiring and to secure a large operation margin of the circuit.

Embodiment 4

Figure 8:
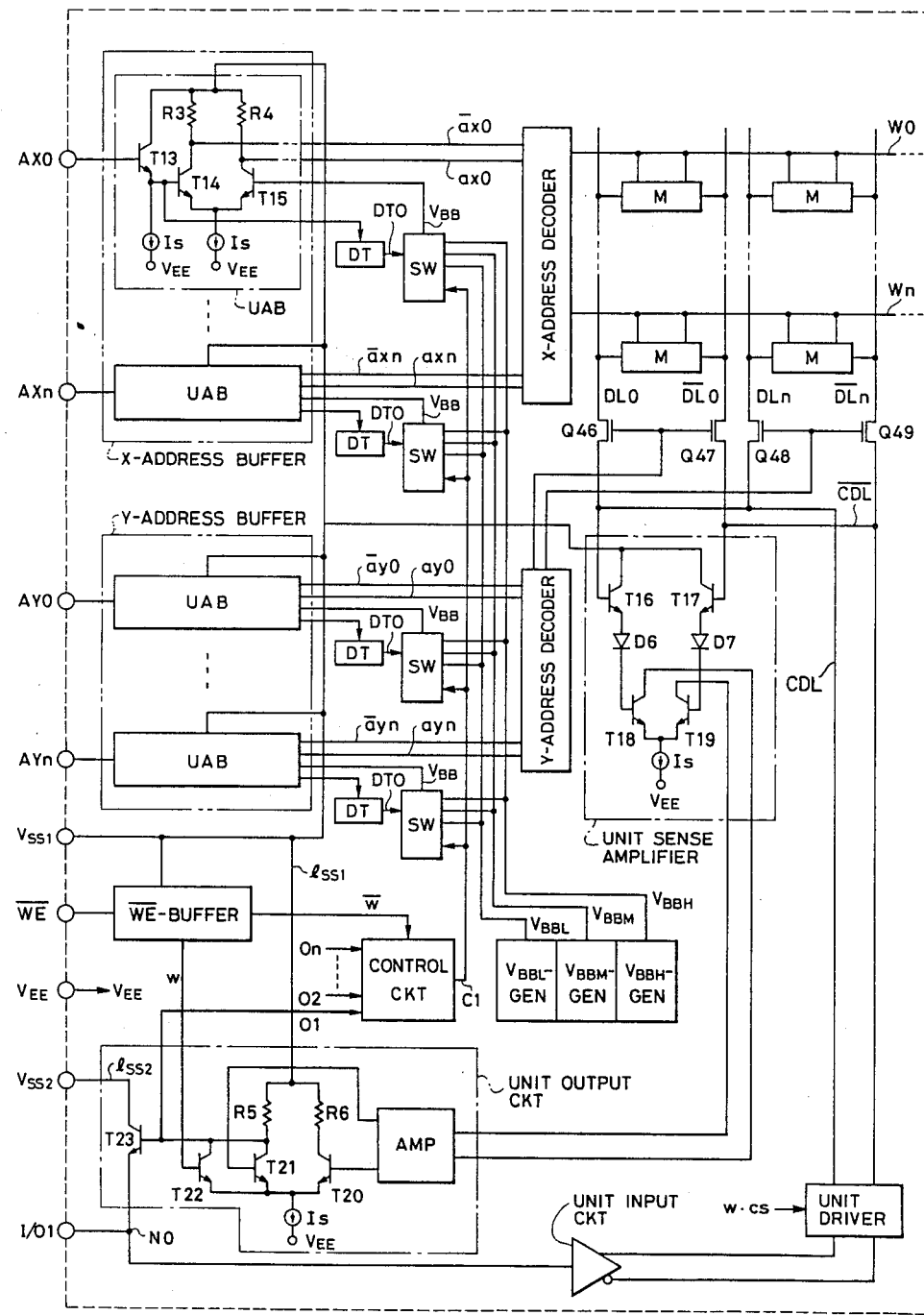
FIG. 8 is a circuit diagram showing still another embodiment of the present invention.

FIG. 8 is a circuit diagram showing the principal portions of a static RAM in accordance with still another embodiment of the present invention.

In the drawing, each circuit encompassed by the dashed line is formed on one semiconductor substrate by a known semiconductor integrated circuit technique. The static RAM of this embodiment is of the type of RAM in which access is made in the unit of a plurality of bits, such as x8 bits, but a definite circuit for only one bit among the x8 bits is shown in the drawing in order to simplify illustration and to have the invention more easily understood.

X system address signals Axo~Axn are supplied from outside to the X-address buffer through external input terminals Axo~Axn and this X-address buffer generates complementary address signals axo, $\overline{ax}$o~axn, $\overline{ax}$n. These signals are supplied to an X-address decoder. The X-address decoder decodes the complementary address signals and selects a word line (e.g. Wo) designated by the complementary address signals from a plurality of word lines Wo~Wn. Y system address signals Ayo~Ayn are supplied to a Y-address buffer through external terminals Ayo~Ayn and converted to complementary address signals ayo, $\overline{ay}$o~ayn, $\overline{ay}$n by the Y-address buffer. A Y-address decoder decodes these complementary address signals ayo, $\overline{ay}$o~ayn, $\overline{ay}$n and supplies the selection signal obtained by decoding to a column switch consisting of MOSFETs Q46 to Q49. As shown in the drawing, the column switch is interposed between a plurality of pairs of data lines DLo, $\overline{DL}$o~DLn, $\overline{DL}$n and a common data line pair CDL, $\overline{CDL}$ and connects the data line pair (e.g. data line pair DLo and $\overline{DL}$o) designated by the Y system address signals Ayo to Ayn among a plurality of data line pairs in response to the selection, signal supplied from the Y-address decoder.

In this manner, one word line (Wo) and one pair of data lines (DLo, $\overline{DL}$o) are selected from a plurality of word lines and a plurality of data line pairs in accordance the address signals Axo~Axn, Ayo~Ayn. The memory cells are connected to the points of intersection between the word line and the data line pair. As shown in FIG. 9, each memory cell MC consists of a pair of mutually cross-connected MOSFETs Q51, Q52, resistors R7, R8 and a pair of transmission MOSFETs Q50, Q53. These memory cells MC constitute each memory array. When one word line and one data line pair are selected in accordance with the address signals Axo~Axn, Ay0~Ayn as described above, the memory cell connected to the selected word line and data line pair is selected from the memory array.

The data stored in the selected memory cell is transferred to the common data line pair CDL, $\overline{CDL}$ through the column switch. A unit sense amplifier is connected to the common data line pair CDL, $\overline{CDL}$. The unit sense amplifier consists of bipolar transistors T16, T17 whose bases are connected to the common data line pairs CDL, $\overline{CDL}$ and whose collectors to the ground potential wiring lssl of the circuit, transistors T18, T19 connected in the differential form, constant current sources Is connected between the common emitter of the differential transistors T18, T19 and a negative potential node $V_{EE}$ and diodes D6, D7 connected between the emitters of the transistors T16, T17 and the bases of the transistors T18, T19. The signal transferred from the selected memory cell M to the common data line CDL through the column switch is level-shifted by the transistor T16 and the diode D6 and transmitted to the base of the differential from the selected memory cell to the common data line $\overline{CDL}$ is level-shifted by the transistor T17 and the diode D7 and transmitted to the base of the differential transistor T19. The data of the selected memory cells transferred to the bases of the differential transistors T18, T19 are amplified by these transistors and transmitted to a unit output circuit.

The unit output circuit consists of an amplification circuit AMP which receives the pair of complementary output signals outputted from the unit sense circuit and amplifies them, a bipolar current switch circuit which is controlled by the complementary signals outputted from the amplification circuit AMP and a bipolar output transistor T23 which receives the output signal of the bipolar current switch circuit at its base. The collector of transistor T23 is connected to an external power source terminal Vss2 through the ground potential wiring lss2 of the circuit and its emitter is connected to an input/output external terminal I/O1. The bipolar current switch circuit consists of a transistor T20 which receives one of the output signals generated by the amplification circuit AMP at its base, a transistor T21 which receives the other of the output signals of the amplification circuit AMP at its base, resistors R5, R6 connected between the collectors of these transistors T20, T21 and the ground wiring lss1 and constant current sources Is connected between the emitters of these transistors T20, T21 and a negative potential node $V_{EE}$. Furthermore, this current switch circuit includes a transistor T22 which receives the control signal w at its base and which is connected in parallel with the transistor T21 described above.

When the transistor T22 is turned OFF by the control signal w, the transistor T21 or T20 of the unit output circuit is turned ON in accordance with the memory data of the selected memory cell. The output transistor 23, too, is turned ON and OFF in accordance with the stored data of the selected memory cell. When the output transistor T23 is turned ON, a current is supplied from the ground potential Vss of the circuit applied to the external terminal Vss2 to the external terminal I/O1 through the output transistor T23. As a result, the potential of the external terminal I/O1 is substantially equal to the ground potential $V_{ss}$. When the output transistor T23 is turned OFF, on the other hand, the potential of the external terminal I/O$_1$ is set to a value equal to the value of the negative potential source described above by pull-out means (not shown) disposed between the external terminal I/O1 and the negative potential source (not shown). In other words, the RAM of this embodiment is of the open emitter output type.

The input node of each unit input circuit is connected to the input/output external terminal I/O described above, and the unit input circuit generates an output signal having the same phase as that of the input signal supplied thereto and an output signal having the opposite phase. The output signals having the same and opposite phases, that are generated by the unit input circuit, are supplied to and amplified by a unit driver and supplied to the common data line pair CDL, $\overline{CDL}$. The unit driver is controlled by the control signal in such a manner as to amplify and transmit the output signals having the same and opposite phases described above to the common data line pair CDL, $\overline{CDL}$ under the chip selection state and moreover, in the data write mode.

Since the amplified output signals having the same and opposite phases are transmitted to the common data line pair CDL, $\overline{CDL}$, the data is written into the selected memory cell in the data write mode in accordance with the external input signal supplied to the input/output terminal I/O$_1$.

The control signal w·cs is set to the low level in the read operation so as to prevent the operation of the unit driver described above. In this manner, it is possible to prevent the erroneous write operation in the read mode.

The control signal w is set to the high level in the write operation and the transistor T22 is turned ON, so that the output transistor T23 is turned OFF and the output signal of the amplification circuit AMP is prevented from being transmitted to the unit input circuit.

The control signal w described above is formed on the basis of the write enable signal $\overline{WE}$ applied to the external terminal $\overline{WE}$, though it is not particularly limitative. As will be described elsewhere in detail, a control signal $\overline{w}$ having substantially the same phase as the write enable signal $\overline{WE}$ and a control signal w having substantially the opposite phase are generated by a write enable signal buffer $\overline{WE}$-buffer having the same construction as that of the unit address buffer UAB which will be described later in detail.

The X-address buffer consists of a plurality of unit address buffers UAB and the Y-address buffer consists likewise of a plurality of unit address buffers UAB. Since each unit address buffer has mutually the same construction, though not particularly limitative, only the circuit of the unit address buffer UAB which receives the address signal Axo is shown in detail in the drawing.

The unit address buffer UAB includes an emitter follower circuit which receives the address signal Axo supplied through the external input terminal Axo and a bipolar current switch circuit which receives the output signal of the emitter follower circuit and the reference potential $V_{BB}$. The emitter follower circuit consists of a bipolar transistor T13 whose base is connected to the external terminal Axo, whose collector is connected to the ground potential line lss1 and whose emitter is connected to the negative potential node $V_{EE}$ through the constant current source Is. The current switch circuit consists of a bipolar transistor T14 whose base receives the output signal of the emitter follower circuit described above, whose collector is connected to the ground potential wiring lss1 through a resistor R3 and whose emitter is connected to the negative potential node $V_{EE}$ through the constant current source Is, and of a bipolar transistor T15 whose base receives the reference voltage $V_{BB}$, whose collector is connected to the ground wiring lss1 through a resistor R4 and whose emitter is connected to the emitter of the transistor T14 described above. The complementary output signals axo, $\overline{axo}$ of the afore-mentioned X-address buffer are generated on the basis of the signals at the collectors of these transistors T15 and T14.

The transistor T14 in the current switch circuit is turned ON when the potential of the output signal of the emitter follower circuit is higher than the reference potential $V_{BB}$ and is turned OFF when the former is lower than the latter. The transistor T15 is turned ON when the reference potential $V_{BB}$ is higher than the potential of the output signal of the emitter follower circuit and is turned OFF when the former is lower than the latter. Therefore, when a high level address signal Axo having a potential higher than a certain predetermined potential (logic threshold voltage) determined by the reference potential $V_{BB}$ is inputted, the unit address buffer UAB generates a high level internal address signal axo and a low level internal address signal $\overline{axo}$. On the other hand, when a low level address signal Axo having a lower potential than the predetermined potential described above is inputted, the unit address buffer UAB generates a low level internal address signal axo and a high level internal address signal $\overline{axo}$.

In this embodiment, the following circuit is disposed in the static RAM in order to prevent the erroneous operation of the input circuit (address buffer) due to the noise that develops when the output node No of the output circuit is brought into the high impedance state.

Figure 10:
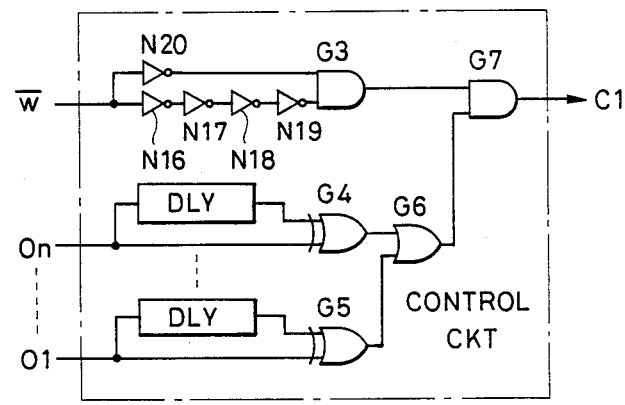
FIG. 10 is a circuit diagram showing an example of the control circuit shown in FIG. 8.

In FIG. 8, the control circuit is one that receives the output signal $0_1, 0_2 \sim 0_n$ of the current switch circuit of each unit output circuit and the control signal $\overline{w}$ having substantially the same phase as the write enable signal $\overline{WE}$ and detects the change of the control signal $\overline{w}$ from the high level to the low level, or in other words, the change of the output node of each unit output circuit to the high impedance state, at the timing at which the output signal of any of the unit output circuits described above changes. The more detailed construction of this control circuit is shown in FIG. 10. Namely, the control circuit includes an output signal change detection circuit consisting of exclusive-OR circuits G4, G5 which receive the output signal $0_i (i=1 \sim n)$ described above at one of the input nodes and the output signal at the other input node through a delay circuit DLY and an exclusive-OR circuit G6 to which the output signals of these exclusive-OR circuits G4, G5 are supplied. The exclusive-OR circuit described above, such as G5, or example, generates a high level output signal because the levels of the signals applied to its two inputs are different by the delay time of the delay circuit DLY when the level of the output signal $0_1$ changes. Such a change detection circuit is disposed for each of the output signals ($0_l \sim 0_n$) of the unit output circuit and the change detection output of each change detection circuit is supplied to the exclusive-OR circuit G6. Accordingly, the exclusive-OR circuit G6 generates the high level output signal when any of the output signals ($0_1 \sim 0_n$) described above changes.

On the other hand, the control signal $\overline{w}$ is supplied to one of the input nodes of an AND circuit G3 through an inverter N20, and to the other input node of the AND circuit G3 through inverters N16~N19 that constitute the delay circuit. Therefore, when the control signal $\overline{w}$ changes from, the high level to the low level, the high level signals are applied to both input nodes of the AND circuit G3 so that the AND circuit G3 generates the high level output signal. This high level output signal is applied to an AND circuit G7 together with the output signal of the exclusive-OR circuit G6 described above. Accordingly, the AND circuit G7 generates a high level control signal $C_1$ at the timing at which at least one of the output signals ($0_1 \sim 0_n$) changes and moreover, at the timing at which the write enable signal $\overline{WE}$ changes from the high level to the low level.

The output signal $C_1$ of the control circuit described above is supplied to a switch circuit SW disposed for each of the unit address buffers UAB. In addition to this control signal $C_1$, the output signal DT0 of the input signal detection circuit DT is supplied to this switch circuit SW. The construction of this switch circuit will be described later in further detail with reference to FIG. 11. When the control signal $C_1$ is at the low level, the switch circuit SW supplies the reference potential $V_{BBM}$ as a reference potential $V_{BB}$ to each unit address buffer UAB. When the control signal $C_1$ is at the high level, on the other hand, it supplies the reference potential $V_{BBL}$, which is generated by a reference potential generation circuit $V_{BBL}$-Gen in accordance with the level of the output signal DT0 of the input signal detection circuit DT, or a reference potential $V_{BBH}$, which is generated by a reference potential generation circuit $V_{BBH}$-Gen, as a reference potential $V_{BB}$ to each unit address buffer.

The input signal detection circuit DT receives the output signal of the emitter follower circuit inside the unit address buffer UAB corresponding to the input signal detection circuit DT, and generates a low level output signal DT0 when the output signal of the emitter follower circuit has a potential higher than a predetermined logic threshold voltage and a high level output signal DT0 when the output signal of the emitter follower circuit has a potential lower than the latter. Such an input signal detection circuit can be accomplished easily by, for example, a phase inversion type amplification circuit having the predetermined logic threshold voltage described above.

Figure 11:
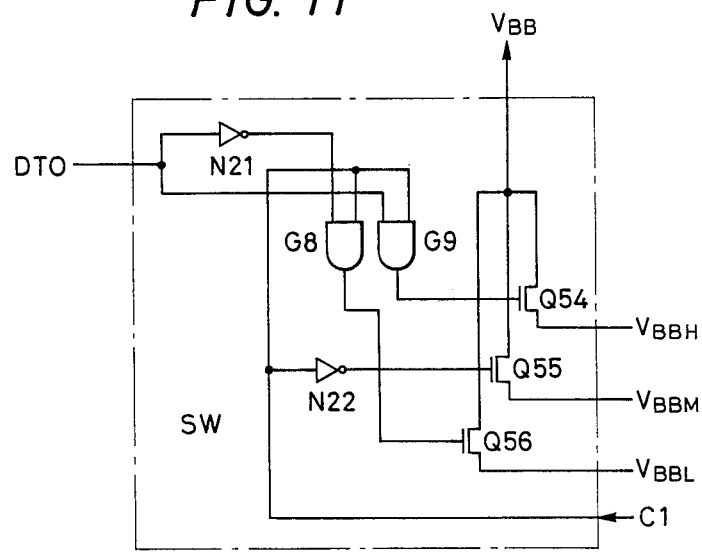
FIG. 11 is a circuit diagram showing an example of the switching circuit shown in FIG. 8.

As shown in FIG. 11, the switch circuit SW includes control means consisting of an AND circuit G8 which receives the control signal $C_1$ at one of its input nodes and the detection signal DTO of the input signal detection circuit DT described above at the other input node, an AND circuit G9 which receives the control signal $C_1$ at one of its input nodes and a detection signal DTO inverted by an inverter N21 at the other input node and an inverter N22 for inversing the control signal $C_1$ described above. Furthermore, the switch circuit SW includes reference potential selection means consisting of MOSFET Q55 whose switching operation is controlled by the output signal of the inverter N22, MOSFET Q54 whose switching operation is controlled by the output operation of the AND circuit G9 and MOSFET Q56 whose switching operation is controlled by the output signal of the AND circuit G8. In the switch circuit SW, the circuit G9 generates a high level output signal when the control signal $C_1$ is at the high level and the detection signal DTO is at the high level, too. Accordingly, MOSFET Q54 is turned ON and the reference potential $V_{BBH}$ is selected as the reference potential $V_{BB}$ and is supplied to the unit address buffer UAB. When the control signal $C_1$ is at the high level and the detection signal DTO is at the low level, the output signal of the circuit G8 is at the high level and MOSFET Q56 is turned ON so that the reference potential $V_{BBL}$ is selected and supplied to the unit address buffer. On the other hand, when the control signal $C_1$ is at the low level, MOSFET Q55 is turned ON irrespective of the level of the detection signal DTO. Therefore, the reference potential $V_{BBM}$ is selected and supplied to the unit address buffer UAB.

The reference potential generation circuit $V_{BBh}$-Gen generates the reference potential $V_{BBH}$ having a potential higher than the reference potential $V_{BBM}$ generated by the reference potential generation circuit $V_{BBM}$-Gen. In contrast, the reference potential generation circuit $V_{BBL}$-Gen generates the reference potential $V_{BBL}$ which is lower than the reference potential $V_{BBM}$ described above.

As can be understood from the description given above, the switch circuit SW supplies the reference potential $V_{BBH}$ having a relatively high potential or the reference potential $V_{BBL}$ having a relatively low potential to the unit address buffer UAB in the transition period of any of the output signals of the output circuit and at the timing at which the write enable signal $\overline{WE}$ changes from the high level to the low level. In other words, when the high level (the level close to the ground potential $V_{ss}$ of the circuit) address signal Axo is supplied to the unit address buffer UAB at this timing, the reference potential $V_{BBL}$ having the relatively low potential is supplied to the unit address buffer UAB. When the low level (the level close to the negative potential $V_{EE}$) is supplied to the unit address buffer UAB, on the other hand, the reference potential $V_{BBH}$ having the relatively high potential is supplied to the unit address buffer UAB. Accordingly, the logic threshold voltage of the unit address buffer UAB is changed at the timing at which noise might occur. Moreover, when the input signal (address signal Axo) is at the high level, its logic threshold voltage is lowered and when the input signal is at the low level, on the contrary, its logic threshold voltage is raised. As a result the noise margin of the input circuit can be increased. Moreover, since each of the unit address buffers constituting the address buffer changes the logic threshold voltage in accordance with the potential of the input signal in this embodiment, the possibility of the erroneous operation can be further reduced.

FIGS. 12(A) to 12(E) show waveforms useful for understanding the operation of the circuit of FIG. 8.

As shown in FIG. 12(A); when the address signals Axi, Ayi (i=0~n) are fixed, the potential of the output terminal Dout 1 of the unit output circuit is changed from the low level (close to $V_{EE}$) to the high level (close to $V_{ss}$) as shown in FIG. 12(B). In the transition period of the potential at this output terminal Dout 1, when the write enable signal $\overline{WE}$ is changed from the high level to the low level in order to execute the write operation, the output transistor T23 in the unit output circuit is rapidly switched from ON to OFF by the control signal w. In the same way as described already, the potential of the wiring lss2 changes due to the change of this state. In this embodiment, in order to prevent the noise that is generated by the output transistor T23 in the output circuits from being transmitted to other circuits such as the address buffer, the ground potential of the circuit is supplied to the output transistors T23 of the output circuits by the power source wiring lss1 for supplying the ground potential to the circuits such as the address buffer, by a second ground potential terminal Vss2 separate from the external power source terminal Vss1 and by the power source wiring lss2 connected to this terminal Vss2. However, noise in the wiring lss2 is sometimes transmitted to the wiring lss1 due to undesirable capacitance coupling between the power source wirings lss1 and lss2 and further to the X-address buffer and the Y-address buffer, thereby generating undesirable circuit operations.

In accordance with this embodiment, however, the reference potential $V_{BB}$ supplied to these X- and Y-address buffers is changed at the timing of the occurrence of noise in order to increase the noise margin of these address buffers as described already. It is thus possible to reduce the erroneous operation in these address buffers.

Though shown only partially in FIG. 8, the ground potential wiring lss1 is connected to the ground potential nodes of the circuit other than the output transistor T23 and to the first ground terminal Vss1. The negative potential node $V_{EE}$ of each circuit is connected to the negative potential terminal $V_{EE}$ through the power source wiring not shown in the drawing. Needless to say, it is possible to use the same wiring for both wirings lss2 and lss1 and to connect it to the external terminal $V_{ss}$. The potential of $V_{ss1}$ is substantially equal to that of $V_{ss2}$.

In the same way as Embodiment 1, the complementary address signals axi, $\overline{axi}$, ayi, $\overline{ayi}$ as the output of the address buffer are supplied to the address decoder without passing through the latch circuit in this embodiment, too. In other words, the complementary address signals are supplied to the address decoder without being latched by the latch circuit, so that the operation speed can be improved and the occurrence of the erroneous operation can be prevented by the additional means described above.

Unlike the RAM of Embodiment 1, the RAM of this embodiment receives the address signals Axi, Ayi having the potential between the ground potential of the circuit and the negative potential, such as the ECL level, the write enable signal $\overline{WE}$ and the input signal Din that are inputted thereto. In this RAM, the resistor is interposed between, for example, the input/output terminal I/O and the negative potential source $V_{EE}$ and the output signal having the potential between the ground potential of the circuit and the negative potential is generated.

Embodiment 5

In the RAM shown in FIG. 8, the input signal detection circuit DT, the switch circuit SW and the reference potential generation circuits $V_{BBL}$-Gen, $V_{BBL}$-Gen are removed and a latch circuit LCH such as shown in FIG. 13 is disposed in place of the unit address buffer UAB.

The latch circuit LCH includes a latch circuit consisting of an inverter N24 and an NAND circuit G10. When the control signal $C_1$ is at the low level (the level close to the negative potential $V_{EE}$), the latch circuit does not latch the address signal Axi (Ayi) but outputs an internal address signal $\overline{axi}$ ($\overline{ayi}$) whose phase is inversed to that of the address signal. At this time, the inverter N25 output an internal address signal axi (ayi) having the same phase as that of the address signal Axi (Ayi). When the control signal $C_1$ is at the high level (the level close to the ground potential $V_{ss1}$), on the other hand, the address signal Axi (Ayi) is latched by the latch circuit for a certain period.

In accordance with this embodiment, the latch circuit latches the address signal Axi (Ayi) in the period in which noise might occur. Accordingly, it is possible to prevent the erroneous operation of the address buffer due to noise.

In Embodiment Nos. 4 and 5 described above, the control signal w which brings the output of the output circuit to the high impedance state is generated on the basis of the write enable signal $\overline{WE}$, but it may be generated on the basis of the chip selection signal $\overline{CS}$ and the write enable signal $\overline{WE}$. In other words, under the chip selection state, the high level control signal w may be generated when the write enable signal $\overline{WE}$ changes to the write mode. Furthermore, the control signal w may be generated on the basis of the write enable system signal WE, the chip selection system signal $\overline{CS}$ and the output enable system signal $\overline{OE}$ as shown in FIG. 4.

In Embodiments 4 and 5, the address buffers disclosed in the afore-mentioned U.S. patent application can be used for the X- and Y-address buffers, respectively.

The embodiments described above provide the following action and effect.

(1) Since the circuit, which receives the input signal to be supplied to the output circuit and takes in the signal at the output terminal of the output circuit for a predetermined period when the output signal of the output circuit changes from the level on the power source voltage side to the level of the ground potential side, is provided, the operation margin of the input circuit can be increased by fixing the output signal of the input circuit for the predetermined period described above or by shifting the logic threshold voltage of the input circuit for the predetermined period in accordance with the output signal of the circuit, for the input circuit which receives the input signal supplied from the external terminal.

(2) Since the circuit which detects the change timing of the control signal for switching the output circuit from the operative state to the inoperative state is provided, the operation margin of the input circuit can be increased by fixing the output signal of the input circuit, which receives the input signal supplied from the output terminal, for a predetermined period or by shifting the logic threshold voltage to the ground potential side of the circuit for the predetermined period in accordance with the output signal of this detection circuit.

(3) The function of substantially invalidating output control signal, which brings the output of an output circuit for generating an output signal to be outputted to the high impedance state in the transition period of the output signal by a delay signals of complementary signals with respect to the output signal is added to the output circuit having a tri-state output function. Since it becomes possible to prevent the output current of the output circuit from being cut off drastically, the occurrence of noise can be suppressed and the operation margin can be increased.

(4) RAM is provided with means for detecting the forced change of an output signal to the high impedance state in its transition period and changing the logic threshold voltage of the input circuit. Accordingly, the operation margin of the input circuit can be increased. In addition, the threshold voltages of the unit circuits constituting the input circuit are changed separately so that their respective operation margin becomes great. Therefore, the erroneous operation can be further reduced.

(5) A RAM is equipped with means for detecting the forced change of the output signal to the high impedance state during its transition period and for latching the input signal. Accordingly, it is possible to prevent the input signal from being taken into the RAM as a wrong value.

(6) Since the operation margin can be increased by the effect described in item (5) above, it is possible to provide a static RAM capable of high speed access in many bits such as 8 bits.

Although the present invention has thus been described with reference to some preferred forms thereof, the invention is not particularly limited thereto but can of course be changed or modified in various manners without departing from the scope and spirit thereof. For example, the memory cell MC may use a CMOS flip-flop circuit using P-channel MOSFETs in place of the afore-mentioned resistors R7, R8. Besides the push-pull output circuit consisting of the transistor and MOSFET, the output circuit may use N-channel MOSFETs or P-channel MOSFETs.

In the circuit shown in FIG. 1, the signal obtained through MOSFETs Q42 and Q43 may be supplied to a MOSFET for fixing the output level or changing the logic threshold voltage which is disposed in the input circuit such as the address buffer.

Various definite circuit constructions may be employed for the signal change detection circuit OETD shown in FIG. 4. In FIG. 6, a control circuit having the same function as that of the control circuit disposed at the base of the transistor T11 may also be disposed for the output MOSFET Q41.

Various definite circuit constructions can be employed for other peripheral circuits constituting the static RAM described above.

Besides the static RAM of the type described above, the present invention can be applied to a dynamic RAM consisting of bipolar transistors and MOSFETs, a logic circuit (gate array) consisting of a bipolar transistor and MOSFET, and the like. Furthermore, the present invention can be utilized for a semiconductor integrated circuit device consisting of bipolar transistors alone and for a semiconductor integrated circuit device consisting of MOSFETs alone.

The present invention can be used widely for various semiconductor integrated circuit devices having an output circuit for generating an output signal of a relatively large signal level such as a TTL level or a CMOS level to external terminals. It can be applied, too, to a semiconductor integrated circuit device for handling ECL level signals.

What is claimed is:

1. A semiconductor integrated circuit device comprising:
   external input terminals to which external input signals are to be supplied;
   a first input circuit connected to said external input terminals and generating internal signals in accordance with said external input signals;
   an internal circuit connected to said first input circuit and generating internal output signals in response to said internal signals;
   an output circuit having input nodes connected to said internal circuit and an output node connected to an external terminal, and generating an external output signal in accordance with said internal output signals;
   a first power source wiring connected to said first input circuit and supplying a predetermined power source voltage;
   control means connected to said output circuit, for controlling said output circuit so that the output node of said output circuit attain a high impedance state; and
   input circuit control means connected to said first input circuit, for detecting a change of the output node of said output circuit to the high impedance state by said control means in a transition period in which a potential of said external output signal generated by said output circuit changes, and for changing a threshold voltage of said first input circuit based on the detected change.

2. A semiconductor integrated circuit device according to claim 1, wherein said first input circuit includes a detection circuit connected to said external input terminals and comparing a reference voltage with said external input signals to generate said internal signals, said semiconductor integrated circuit device further including a variable reference potential generation means for receiving an output signal of said input circuit control means and said external input signals and outputting said reference voltage.

3. A semiconductor integrated circuit device according to claim 2, wherein said variable reference potential generation means includes a reference potential generation circuit for generating a plurality of mutually different reference potentials, detection means for detecting the potential of said external input signals and selection means for supplying one of said reference potentials to said detection circuit in accordance with detection output signals of said detection means and the output signal of said input circuit control means.

4. A semiconductor integrated circuit device according to claim 1, wherein said control means includes means for generating a control signal for bringing the output node of said output circuit into the high impedance state, and said input circuit control means includes detection means for detecting said control signal, a change detection circuit for detecting the change of said external output signal and logic means for receiving the detection output signal of said detection means and the change detection output signal of said change detection circuit and generating an output signal to be supplied to said first input circuit when said external output signal is in the transition period and moreover, when said output node is under the high impedance state.

5. A semiconductor integrated circuit device according to claim 3, wherein said control means includes means for generating a control signal for bringing the output node of said output circuit into a high impedance state, and said input circuit control means includes detection means for detecting the occurrence of said control signal, a change detection circuit for detecting the change of said external output signal, and logic means for receiving the detection output signal of said detection means and the change detection output signal of said change detection circuit and generating an output signal to be supplied to said selection means when said external output signal is in the transition period and moreover, when said output node is under the high impedance state.

6. A semiconductor integrated circuit device according to claim 5, wherein said output circuit includes a transistor connected between said output node and a power source wiring which is different from said first power source wiring, a control circuit connected to said input node, said transistor and said first power source wiring and driving said transistor, and means connected to said control circuit, for turning OFF said transistor in response to said control means.

7. A semiconductor integrated circuit device according to claim 6, which further comprises a second input circuit connected between said external terminal and said internal circuit and supplying an internal signal to said internal circuit in accordance with a signal supplied to said external terminal.

8. A semiconductor integrated circuit device according to claim 7, wherein said internal circuit includes a memory array containing a plurality of memory cells, decoders connected between said first input circuit and said memory array said decoders selecting a predetermined memory cell and common data lines connected to the selected predetermined memory cell, said output circuit and said second input circuit.

9. A semiconductor integrated circuit device according to claim 8, wherein each of said memory cells includes a pair of mutually cross-connected MOSFETs and resistance elements connected between the pair of said MOSFETs and said first wiring.

10. A semiconductor integrated circuit device comprising:
external input terminals to which external input signals are to be supplied;
a first input circuit connected to said external input terminals and generating internal signals in accordance with said external input signals;
an internal circuit connected to said first input circuit and generating internal output signals in response to said internal signals;
an output circuit having input nodes connected to said internal circuit and output nodes connected to external terminals, and generating external output signals in accordance with said internal output signals;
a first power source wiring connected to said first input circuit and supplying a predetermined power source voltage;
control means connected to said output circuit, for controlling said output circuit so that the output nodes of said output circuit attain a high impedance state; and
input circuit control means connected to said first input circuit, for detecting the change of the output nodes of said output circuit to the high impedance state by said control means in a transition period in which a potential of said external output signals generated by said output circuit changes, and for changing a threshold voltage of said first input circuit based on the detected change,
said first input circuit including latch means for latching said external input signals in response to a detection signal outputted from said input circuit control means.

11. A semiconductor integrated circuit device according to claim 10, which further comprises a second input circuit connected between said external terminals and said internal circuit and receiving input signals supplied to said external terminals to generate internal signals in accordance with said input signals during the period in which said output nodes are under the high impedance state.

12. A semiconductor integrated circuit device according to claim 11, wherein said internal circuit includes a memory array containing a plurality of memory cells, a decoder connected between said first input circuit and said memory array said decoder selecting a memory cell from said memory cells, and common data lines connected to said input nodes of said output circuit and said second input circuit.

13. A semiconductor integrated circuit device according to claim 12 wherein each of said memory cells includes a pair of mutually cross-connected MOSFETs and resistors connected between the pair of said MOSFETs and said first wiring.

14. A semiconductor integrated circuit device comprising:
external input terminals to which external input signals are to be supplied;
an input circuit connected to said external input terminals and generating internal signals in accordance with said external input signals;
an internal circuit connected to said first input circuit and generating internal output signals in response to said internal signals;
an output circuit having input nodes connected to said internal circuit and output nodes connected to external terminals and generating external output signals in accordance with said internal output signals;
a power source wiring connected to said input circuit and said output circuit, for supplying a predetermined power source voltage;
control means connected to said output circuit, for controlling the operation of said output circuit; and
input circuit control means connected to said input circuit, for changing a threshold voltage of said input circuit when said output circuit is changed from the operative state to an inoperative state.

15. A semiconductor integrated circuit device according to claim 14, wherein said input circuit control means includes means for changing the threshold voltage of said input circuit for a predetermined period of time.

16. A semiconductor integrated circuit device according to claim 14, wherein said control means includes means for generating a control signal for bringing said output circuit to the inoperative state, and said input circuit control means includes means for changing the threshold voltage of said input circuit for a predetermined period upon detecting the generation of said control signal.

17. A semiconductor integrated circuit device according to claim 16, wherein said internal circuit includes a memory array containing a plurality of memory cells, decoders connected between said memory array and said input circuit, for selecting a memory cell from said memory array, and common data lines connected to the selected memory cell and the input nodes of said output circuit.

18. A semiconductor integrated circuit device comprising:
external input terminals to which external input signals are to be supplied;
an input circuit connected to said external input terminals and generating internal signals in accordance with said external input signals;
an internal circuit connected to said first input circuit and generating internal output signals in response to said internal signals;
an output circuit having input nodes connected to said internal circuit and output nodes connected to external terminals and generating external output signals in accordance with said internal output signals;
a power source wiring connected to said input circuit and said output circuit, for supplying a predetermined power source voltage;
control means connected to said output circuit, for controlling the operation of said output circuit; and
input circuit control means connected to said input circuit and fixing said internal signal generated by said input circuit to a predetermined state when said output circuit is changed from an operative state to an inoperative state.

19. A semiconductor integrated circuit device according to claim 18, wherein said input circuit control means includes means for fixing said internal signal to a predetermined state for a predetermined period.

20. A semiconductor integrated circuit device according to claim 18, wherein said control means includes means for generating a control signal for bringing said output circuit into the inoperative state, and said input circuit control means includes means for fixing said internal signal to a predetermined state for a predetermined period upon detecting the generation of said control signal.

21. A semiconductor integrated circuit device according to claim 20, wherein said internal circuit includes a memory array containing a plurality of memory cells, decoders connected between said memory array and said input circuit, for selecting a memory cell from said memory array, and common data lines connected to the selected memory cell and the input noded of said output circuit.

22. A semiconductor integrated circuit device comprising:
external terminals;
an internal circuit for generating an internal signal;
an output circuit including output nodes connected to at least one of said external terminals and input nodes connected to said internal circuit, and supplying an external signal to said external terminal in accordance with said internal signal;
control means connected to said output circuit, for controlling said output circuit so that said output nodes attain a high impedance state; and
limit means connected to said output circuit, for limiting the change of said output nodes to the high impedance state.

23. A semiconductor memory device comprising:
external input terminals to which address signals are to be supplied;
an input circuit connected to said external input terminals and generating internal address signals in accordance with said address signals;
a plurality of memory cells;
selection means for selecting one memory cell from said memory cells in accordance with said internal address signals;
an output circuit receiving memory data from the selected memory cell and generating an output signal in accordance with this memory data;
an external terminal to which said output signal is to be supplied;
a power source wiring connected to said input circuit and said output circuit, and supplying a power source voltage of a predetermined potential; and
input circuit control means connected to said output circuit and said input circuit, for changing a threshold voltage of said input circuit when the level of said output signal changes.

24. A semiconductor memory device according to claim 23, wherein said input circuit control means includes means for changing the threshold voltage of said input circuit for a predetermined period.

25. A semiconductor memory device according to claim 23, wherein said input circuit control means includes means for changing the threshold voltage of said input circuit from one predetermined potential side to another potential side when said output signal changes from said one predetermined potential to the other potential.

26. A semiconductor memory device according to claim 24, wherein each of said memory cells includes a pair of mutually cross-connected MOSFETs and resistors connected between the pair of said MOSFETs and said power source wiring.

27. A semiconductor memory device according to claim 25, wherein said output circuit includes a bipolar transistor connected between said one potential and said external terminal.

28. A semiconductor memory device according to claim 27, wherein each of said memory cells includes a pair of mutually cross-connected MOSFETs and resistors connected between the pair of said MOSFETs and said power source wiring.

29. A semiconductor memory device comprising:
external input terminals to which address signals are to be supplied;
an input circuit connected to said external input terminals and generating internal address signals in accordance with said address signals;
a plurality of memory cells;
selection means for selecting one memory cell from said memory cells in accordance with said internal address signals;
an output circuit receiving memory data from the selected memory cell and generating an output signal in accordance with this memory data;
an external terminal to which said output signal is to be supplied;
a power source wiring connected to said input circuit and said output circuit, and supplying a power source voltage of a predetermined potential; and
input circuit control means connected to said output circuit and said input circuit, for fixing an internal address signal generated by said input circuit to a predetermined state when the level of said output signal changes.

30. A semiconductor memory device according to claim 29, wherein said input circuit control means includes means for fixing said internal address signal to a predetermined state for a predetermined period.

31. A semiconductor memory device according to claim 29, wherein said input circuit control means includes means for fixing the internal address signal generated by said input circuit to an internal address signal in accordance with an address signal having said one predetermined potential when said output signal changes from said one predetermined potential to another potential.

32. A semiconductor memory device according to claim 30, wherein each of said memory cells includes a pair of mutually cross-connected MOSFETs and resistors connected between the pair of said MOSFETs and said power source wiring.

33. A semiconductor memory device according to claim 31, wherein said output circuit includes a bipolar transistor connected between said one potential and said external terminal.

34. A semiconductor memory device according to claim 33, wherein each of said memory cells includes a pair of mutually cross-connected MOSFETs and resistors connected between the pair of said MOSFETs and said power source wiring.

* * * * *